(12) United States Patent
Väisänen

(10) Patent No.: US 7,646,211 B2
(45) Date of Patent: Jan. 12, 2010

(54) CIRCUIT AND APPARATUS FOR REDUCING INTERFERENCE OF DIGITAL SIGNALS

(75) Inventor: Risto Väisänen, Salo (FI)

(73) Assignee: Nokia Corporation, Espoo (FI)

( * ) Notice: Subject to any disclaimer, the term of this patent is extended or adjusted under 35 U.S.C. 154(b) by 218 days.

(21) Appl. No.: 11/397,920

(22) Filed: Apr. 3, 2006

(65) Prior Publication Data

US 2007/0241946 A1    Oct. 18, 2007

(51) Int. Cl.
  *H03K 17/16*    (2006.01)
(52) U.S. Cl. .......................................... 326/29
(58) Field of Classification Search ................... 326/26, 326/27, 29
  See application file for complete search history.

(56) References Cited

U.S. PATENT DOCUMENTS 4,596,396 A * 6/1986 Merbler .................. 280/11.28
4,596,936 A * 6/1986 Aoyama ..................... 327/166
4,779,013 A   10/1988 Tanaka
4,864,256 A    9/1989 Bamert

FOREIGN PATENT DOCUMENTS

JP        56132035       10/1981
WO      WO 01/35538       5/2001

* cited by examiner

*Primary Examiner*—Rexford N Barnie
*Assistant Examiner*—Thienvu V Tran
(74) *Attorney, Agent, or Firm*—Alfred A. Fressola; Ware, Fressola, Van Der Sluys & Adolphson LLP

(57) ABSTRACT

A circuit for rounding the edges of a digital pulse so as to reduce interference has a first rounding block, a second rounding block and an output stage. The first rounding block rounds the second and fourth pulse edges so as to prolong rising and falling time of the digital pulse. The second rounding block rounds the first and third pulse edges in accordance with non-linear characteristics of a semiconductor of the second rounding block. The output stage is a feedback circuit where the first rounding block is coupled with the second rounding block and the second rounding block is coupled with the feedback circuit.

30 Claims, 14 Drawing Sheets

PRIOR ART

CIRCUIT AND APPARATUS FOR REDUCING INTERFERENCE OF DIGITAL SIGNALS

TECHNICAL FIELD OF THE INVENTION

The invention concerns a circuit for reducing interference of a digital signal. Furthermore the invention concerns an apparatus comprising the circuit and the use of the circuit and the apparatus.

BACKGROUND OF THE INVENTION

Digital signal based apparatuses, such as mobile stations, mobile phones or the like, use high clock frequencies and frequencies of the digital buses. The frequencies have increased all the time. Due to the high frequency also the interference, i.e. radio interference, increases. This is mainly because the rising and falling times of the high frequency digital signals cannot be increased to the same extent than the rising and falling times of the digital signal when using lower frequencies. A known solution so far for the worst interference problems has been based on a frequency planning. Thus it has been pursued to find such clock frequencies and bus frequencies where there are no harmonics or mixing of frequencies at the applied radio channels. However more and more frequency ranges are to be used at the mobile phones. In addition the amount of different communication systems and accessories is increasing. Therefore a mobile phone can use and have systems such as GSM, WCDMA and CDMA each with various different frequency ranges. In addition the mobile phone could use and have WLAN, Bluetooth, GPS, Galileo, WUSB, FM radio, DVB-H, etc. Therefore the frequency planning or designing does not provide much help, because at almost any frequency, a system is being used, which accordingly faces interference.

Another known solution has generally been to increase RF shields such as RF encapsulations. However, due to, for example the increase of different communications systems, the physical space within the mobile phone is limited. RF shielding typically requires a lot of space. Therefore, RF shields are not a feasible solution for modern mobile phones. Furthermore RF shielding does not necessary prevent interferences within an integrated circuit (IC).

Generally, the interferences caused by the digital signals have been tried to be reduced by merely prolonging the rising and falling times of the pulses. Because the clock signal or the load of the circuit of the data bus is considered capacitive, interferences have been tried to be reduced by merely prolonging the rising and falling times and furthermore by limiting the circuit current. Known circuits of FIGS. 1 and 2 depict such solutions. In FIG. 1 capacitors Cx1 and Cx2, a current generator in a block B1, a bias stage and a controller stage prolong the rising and falling times of the pulses. FIG. 2 solution uses a feedback circuit, which is based on a capacitor, wherein the circuit establishes a kind of integrator or an integrating circuit. A pulse or signal V1 inputted to the circuit is show in FIGS. 1 and 2. Both circuits of the FIGS. 1 and 2 result in a pulse V2, which has sloping rising and falling edges (shown in FIG. 1 and 2), when the load is thus capacitive.

Yet another know solution resembles one of FIG. 1. However in this solution the rising and falling edges are formed from several parts, wherein there are different rising (and failing) speeds. An example of this kind of solution has been described in US patent publication U.S. Pat. No. 4,779,013.

However a common characteristic to all these known solutions is that generally they modify the edges of the pulses oblique and the upper corners of the edge of the pulse and lower corners of the edge of the pulse remain with sharp or pointed turnovers. Therefore the emergence of the interference is clear. The output of the circuit causes considerable sharp current peaks to the utilization stage. Therefore the interferences propagate to a large area of the circuit via supply lines and ground leads. These problems are not disadvantageous to, for example to desktop computers, because a computer does not typically have radio frequency components. Furthermore if the desktop computer has the radio frequency components, the radio frequency components can be shielded by RF encapsulation. However, the problem is considerable to portable hand held radio apparatuses such as mobile phones. Furthermore the problem is pertinent to laptop computers containing radio frequency components.

A further problem is that all the above solutions works reasonably well only if the load is capacitive (or resistive). However, the signal is typically always conveyed from circuit to another circuit within the circuit board through the stripline (alternatively referred to as microstrip). The stripline and the input capacitance establish troublesome impedance with respect to the output stage of the circuit (as show for example in FIG. 3). Therefore the above circuit solutions do not work as they should.

FIG. 4 depicts an ideal digital pulse (alternatively referred to as an ideal digital signal), wherein the output stage has a capacitance as a load. FIG. 5 depicts the same pulse of FIG. 4, which is coupled with a load having 50 mm long stripline and 3.5 pF capacitance. The pulse (or the signal) is distorted to near uselessness because the rising and falling edges, i.e. rising and falling moments, are indefinite. This is because the pulse (the signal or the like) reflects from the capacitive load at the other end of the stripline and adds to the signal coming from the output stage of the circuit, etc. Furthermore the signal causes considerable interferences to a large spectrum (as shown for example in FIG. 6). Yet furthermore the signal may interfere the reception and transmission channels of the mobile station and e.g. GPS reception.

SUMMARY OF THE INVENTION

It is therefore the object of the invention to modify the digital pulse (e.g. the signal or the like) so that the interference can be reduced in the circuitry having a stripline and impedance, which impedance is established by a capacitance. For example in the circuitry having a lengthy stripline and the capacitance of the following input stage.

In accordance with an aspect of the invention there is being provided a circuit for rounding first, second, third and fourth edges of a substantially rectangular digital pulse in order to attenuate harmonics interference of said digital pulse, comprising a first rounding block, a second rounding block and an output stage, wherein the first rounding block is arranged to round said second and fourth edges so that rising and falling times of the digital pulse can be prolonged, the second rounding block is arranged to round said first and third edges in accordance with non-linear characteristics of a semiconductor of said second rounding block, and the output stage comprises a feedback circuit, wherein the first rounding block is coupled with the second rounding block and the second rounding block is coupled with said feedback circuit.

Another aspect of the invention discloses a mobile station comprising a circuit for attenuating harmonics interference of the digital pulse on radio frequencies used by the mobile station, wherein the mobile station comprises the circuit.

Yet another aspect of the invention discloses a method and an apparatus for reducing harmonics interference of a digital signal on a frequency of radio communication of a mobile station, comprising detecting said interference, and modifying either a frequency or a shape of a digital signal of the mobile station other than said frequency of the radio communication of the mobile station for reducing said interference.

Various further embodiments of the invention can reduce the interference. Furthermore various further embodiments reduce the costs because RF shielding use is reduced, or RF shielding is not needed at all. Furthermore various further embodiments save the physical space within the apparatus. The reliability of the apparatus can be improved because the waveform of the digital pulses or signals remains clearer. In addition current peaks from the operating voltage are reduced and have such a form that interference can be reduced.

Yet further embodiments of the invention have been specified in the dependent claims.

BRIEF DESCRIPTION OF THE DRAWINGS

The invention will now be described, by way of examples only, with reference to the accompanying drawings, in which.

DESCRIPTION OF FURTHER EMBODIMENTS

Various embodiments of the invention disclose a circuit and an apparatus, by which a digital pulse or the digital signal can be modified into a form, which has few harmonics. Furthermore the digital signal can be maintained clear while inputting to the stripline and to the impedance established by a capacitance.

If the digital signal is desired to be modified into such a form that interference is significantly reduced, the digital pulse should not have sharp or quick turnover, i.e. corners in the falling and rising edges. Thus too rapid transition points or turnovers should be avoided. The output stage should be able to feed the digital signal to the load, which is mainly formed by a lengthy stripline on the circuit board and the input capacitance of the following circuit.

Figure 7:
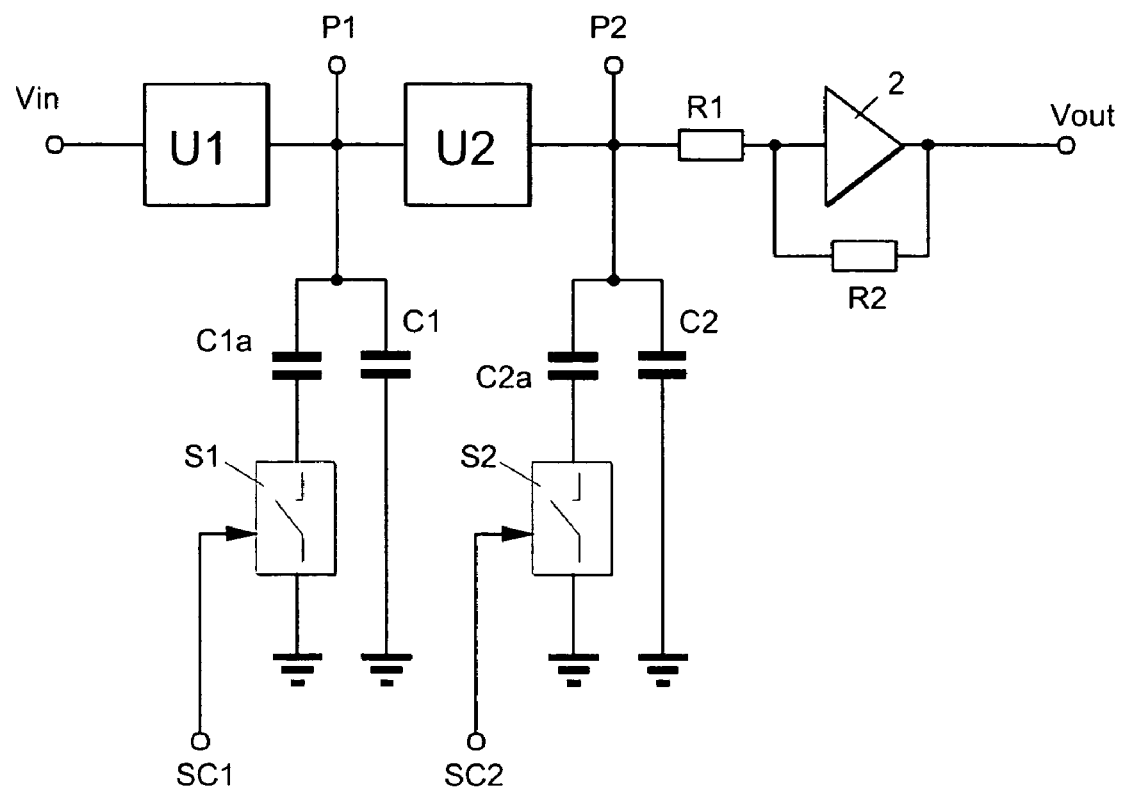
FIG. 7 depicts a circuit in accordance with various further embodiments of the invention.
Figure 11:
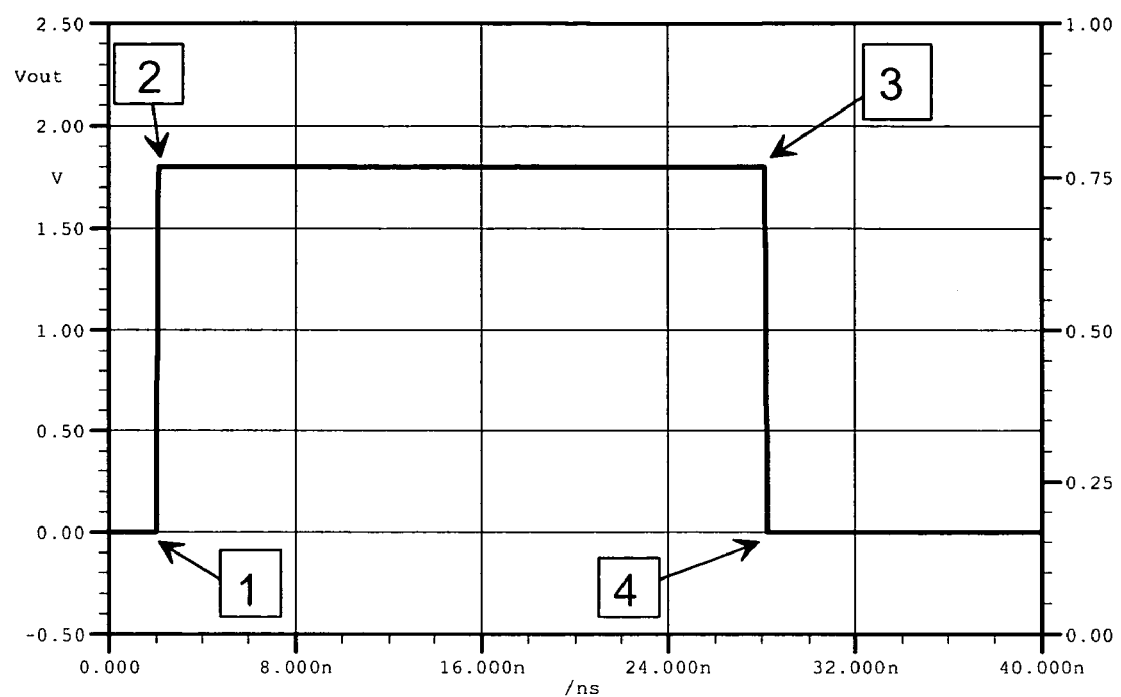
FIG. 11 depicts an example of the input signal Vin.

FIG. 7 depicts a circuit for reducing the interference in accordance with various embodiments of the invention. The circuit is input by generally unmodified input signal Vin. Further embodiments of the signal Vin is depicted in FIG. 11. It should be noted that of course the input signal is only received at the circuit 100 and it can be modified before the reception. In order to describe the various further embodiments more easy, only one digital pulse is considered. It should be noted that various further embodiments of the invention are applicable to a plurality of pulses as well as to the continuous pulse. Corner points (alternatively referred to as turnovers) 1, 2, 3 and 4 in the falling and rising edges are depicted to the pulse Vin in FIG. 11. However it should be noted that the corner points can be indicated differently, for example by inverting logic levels thereby inverting the pulse. In this case, the first corner point can indicate a signal at value e.g. +1V at the moment when the edge starts falling, the second is the signal at value 0 when fallen, third is the rising moment at 0V, and the fourth is the signal when +1V is reached. Accordingly, the corner points vary can dependent on the definition of the signal or the pulse.

Advantageously, the corner points 2 and 4 are rounded. Preferably, the corner points 2 and 4 are rounded first. A rounding block U1 rounds the corner points 2 and 4. In various further embodiments of the invention, a time constant circuit (alternatively referred to as a timing constant circuit or RC time constant circuit) implements the rounding block U1.

Figure 8:
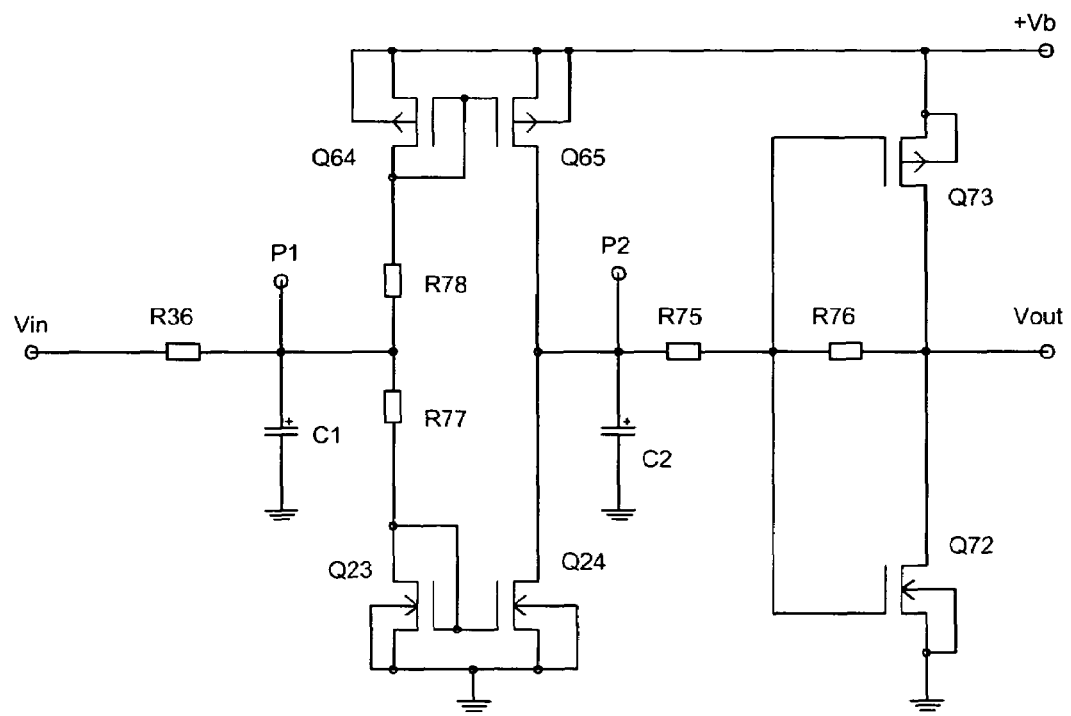
FIG. 8 depicts another example of the circuit in accordance with various further embodiments of the invention.
Figure 12:
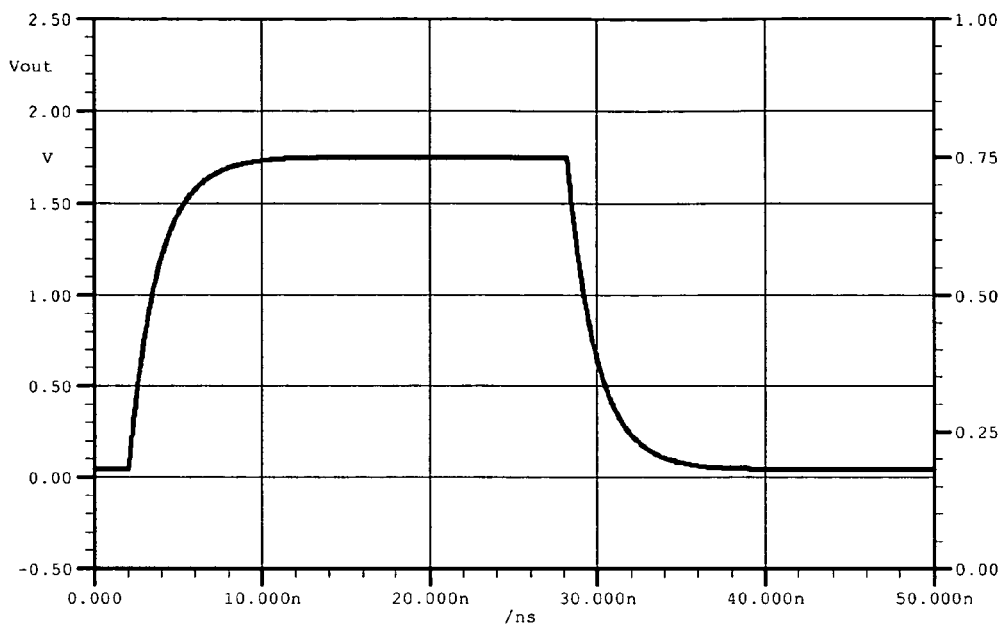
FIG. 12 depicts an example of a signal at point P1 in the circuit of FIG. 7.

In various further embodiments shown FIG. 8 capacitor C1 and resistance R36 establish the time constant circuit. The circuit is measured in such a way that the resistance of resistors R77 and R78 is larger than the resistance of the resistor R36. Thereby the time constant circuit is not loaded too much. When the point Vin in FIG. 7 receives an unmodified rectangular wave signal (shown for example in FIG. 11), the RC circuit (R36 and C1) starts to round the corner points 2 and 4 (an example is depicted in FIG. 12). When Vin is increasing or it has been increased, the capacitance C1 starts to be charged by a time constant $$T = R36 * C1.$$

Thus at the point P1 the voltage starts to increase as a function of time as follows:

$$VP1 = Vin(1 - \exp(-t/T)).$$

When Vin is decreasing or it has decreased back to substantial zero level, the charge of the capacitance C1 starts to be run down by the time constant T.

An example of Vin rounded in this way, showing a modified pulse is depicted in FIG. 12. The rounded pulse correspondences to a point P1 in various further embodiments of FIG. 7.

The first pulse rounding block U1 can be implemented alternatively by resistances, current mirrors and capacitances, and furthermore by utilizing the next stage resistive like load.

Figure 10:
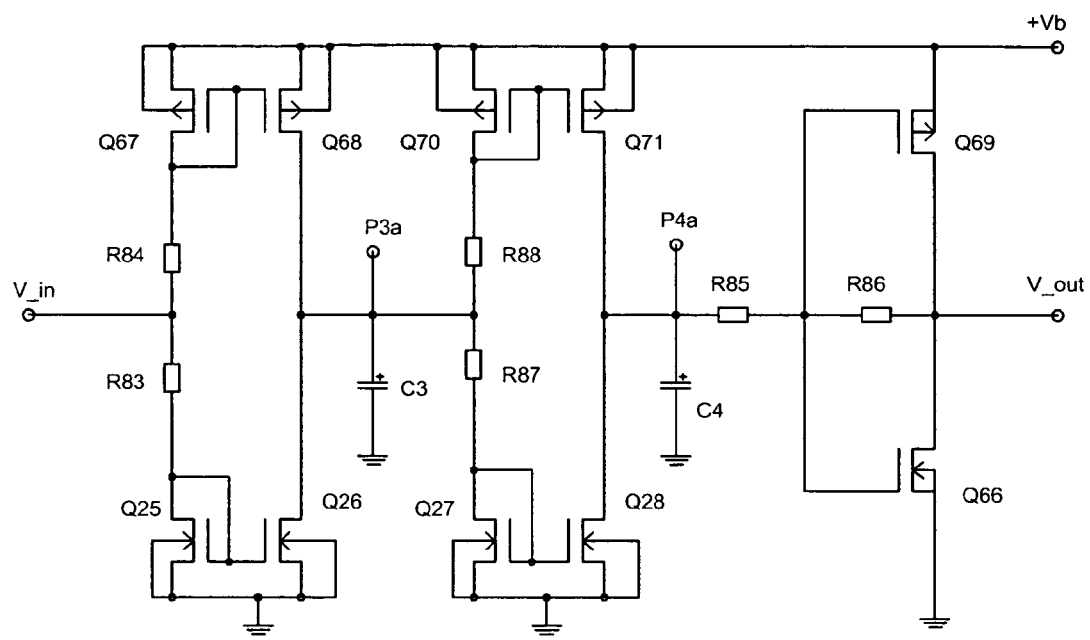
FIG. 10 depicts yet another further example of the circuit in accordance with various further embodiments of the invention.

An example of the various alternatives is depicted in FIG. 10. Advantageously, the value of the first stage capacitance can be dimensioned lower.

In various further embodiments the rounding block for corner point 2 and 4 is established by U1 and capacitance C1 (or C1 and C1a) as referred to in the figures.

Advantageously the corner points 1 and 3 are rounded. Preferably, the corner points 1 and 3 are rounded in the next step after rounding the points 2 and 4. A rounding block U2 rounds the corner points 1 and 3. Because the first rounding block U1 has prolonged the rising and falling times of the pulse, the second rounding can utilize non-linear characteristics of semiconductors. In various further embodiments, MOSFET (metal oxide semiconductor field-effect transistor) can embody the second rounding block. MOSFET has characteristics that drain current (id) increases quadratic when compared with gate source voltage Vgs as follows:

$$Id=K(Vgs-Vth)^2,$$

wherein factor K depends on the length, width and different processes of the FET. Vth is the threshold voltage.

Figure 13:
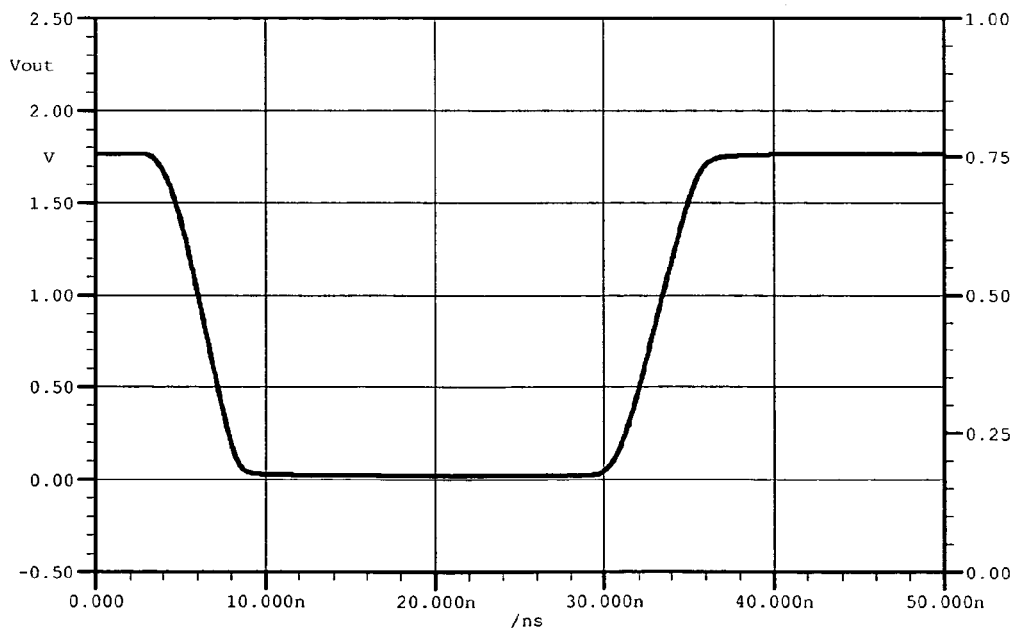
FIG. 13 depicts an example of a signal at point P2 in the circuit of FIG. 7.

The rounding block U2 can thus simply comprise, for example an inverter circuit. Alternatively, the block U2 can comprise two current mirror circuits. The current mirror circuits are coupled with each other. Resistances control the current mirror circuits. Thereby a strongly non-linear amplifying stage is thus established. Various further embodiments of FIG. 8 depict further examples if this kind of circuit U2'. A capacitance C2 in the FIG. 8 is arranged to influence the shape of the pulse and to the rising and falling times. FIG. 13 depicts various further embodiments of the signal at the point P2 in the FIG. 7.

In various further embodiment of FIG. 8 there has been created two current mirror circuits Q23, Q24 and Q64, Q65 from MOSFETs, which current mirror circuits are guided by resistance R77 and R78. At the point P1 the current mirror circuits act non-linearly at the low and high ends of the control voltage, i.e. the change of the current is quadratic when compared to the change of the voltage. This has the effect that the corners, i.e. the edges, of corner points 1 and 3 are rounded. At the middle range of the voltage, the current mirror circuits act linearly and do not affect the shape of the pulse. Thereby, at point p2 there can be clean digital pulse having all edges rounded, i.e. all corner points rounded (an example of the pulse shown on FIG. 13). Capacitance C2 can furthermore affect the shape of the digital pulse and to the rising and falling edges.

Referring to various further embodiments of FIG. 7, an output stage follows the point p2. The output stage can maintain the form of the pulse clear, even though the transfer line and the capacitance establish the load. The output stage comprises a resistive feedback circuit (R1, R2 and amplifier), which preferably reduces the output impedance of the output stage. Furthermore the resistive feedback circuit (R1, R2, amplifier) preferably forces the output signal to follow the input signal.

Figure 1:
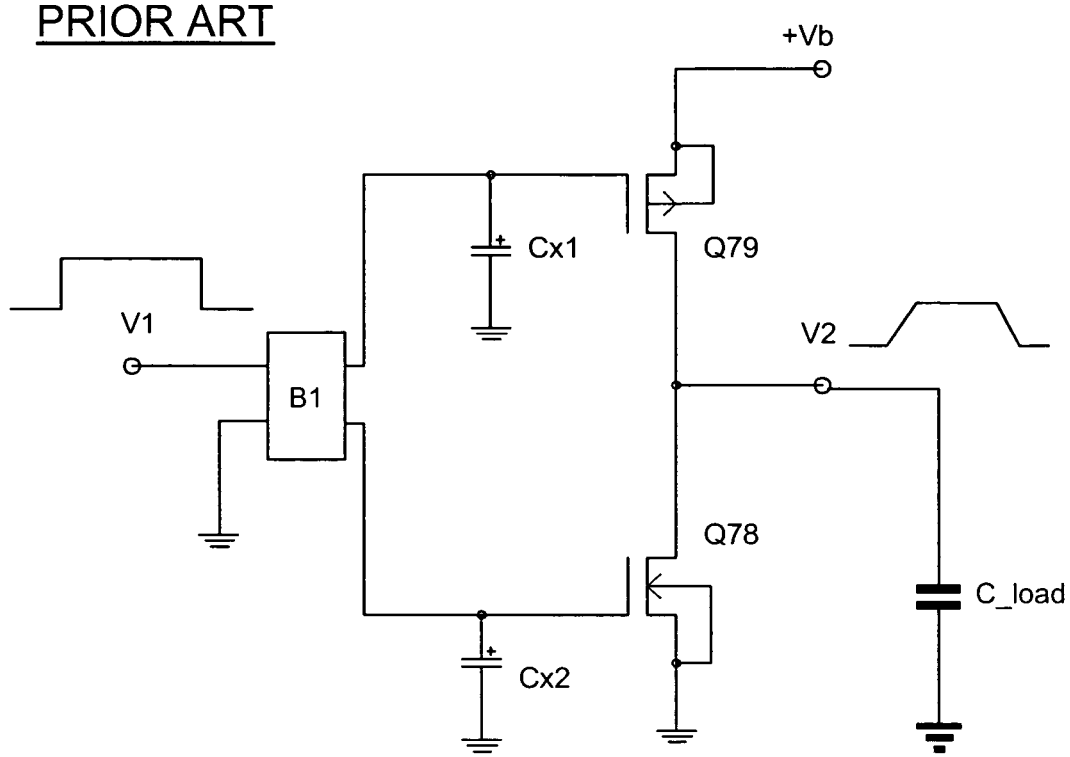
FIG. 1 depicts a known circuit for reducing interference of the digital signal.
Figure 2:
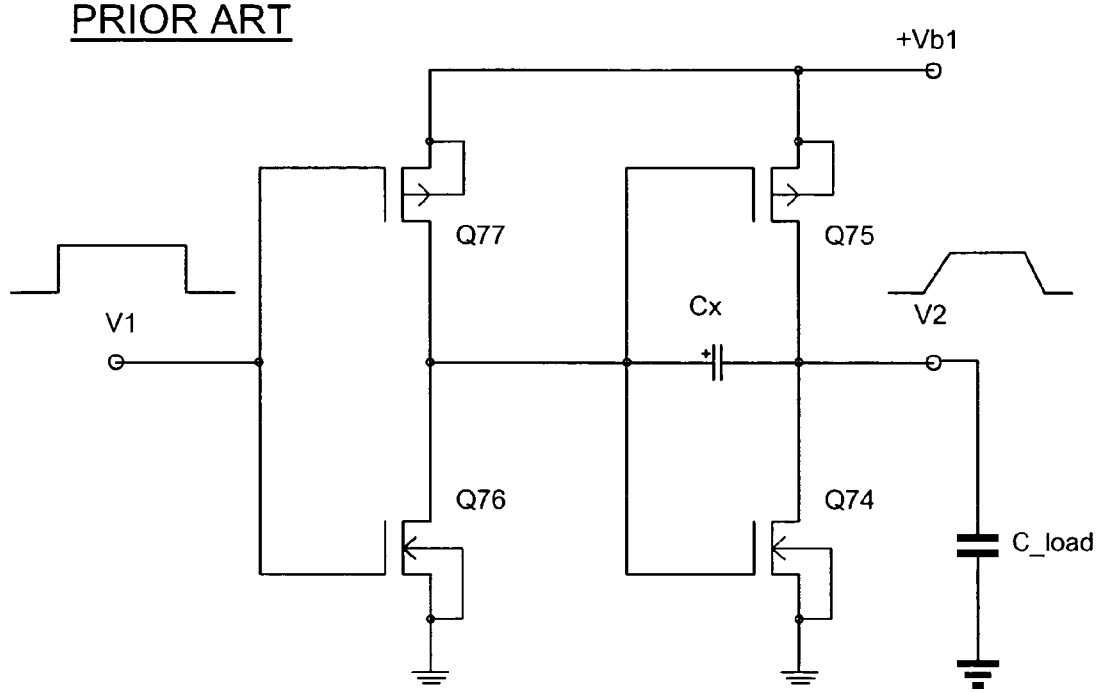
FIG. 2 depicts another known circuit for reducing interference of the digital signal.
Figure 3:
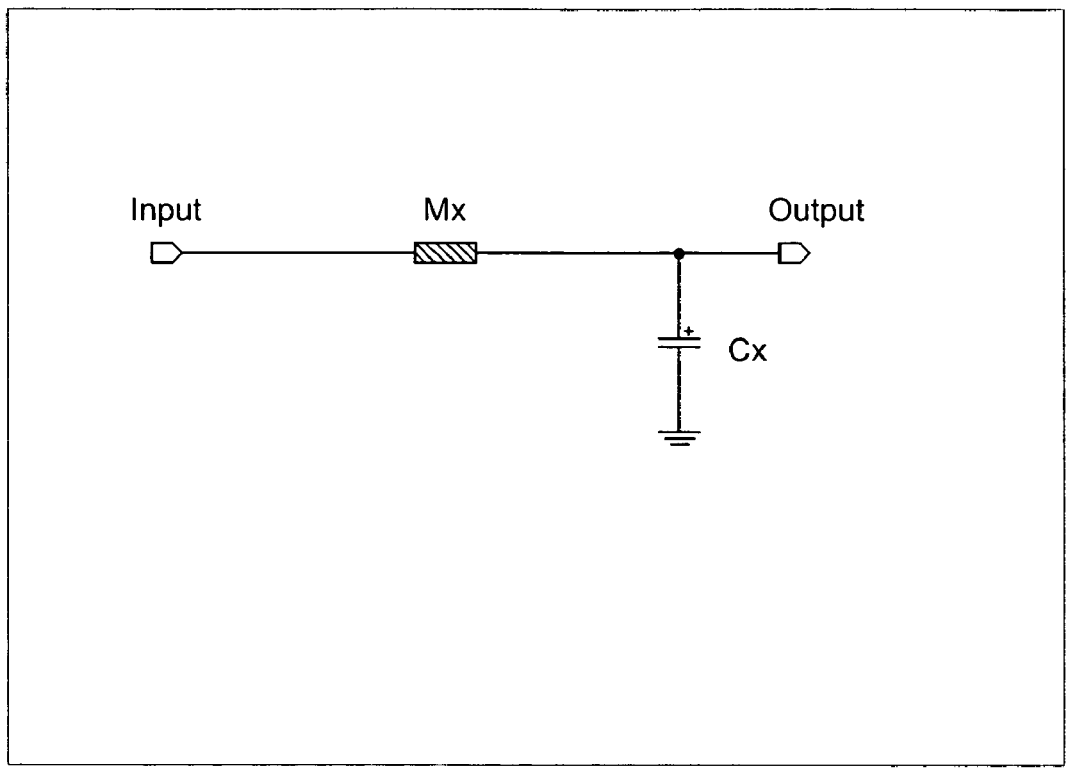
FIG. 3 depicts a circuit diagram in respect of a stripline and an input capacitance of the following stage.
Figure 4:
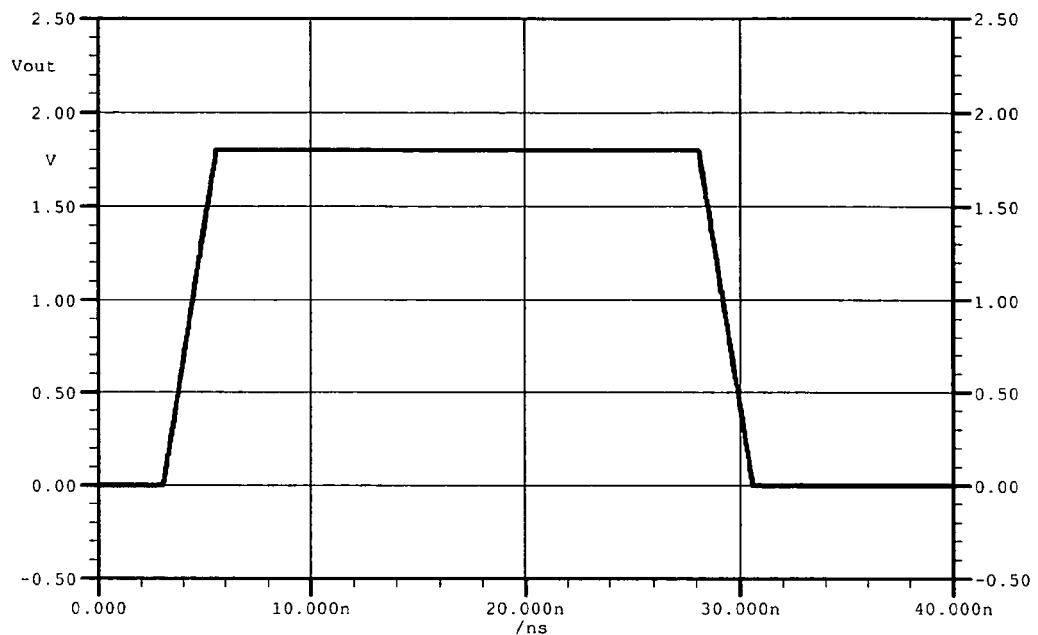
FIG. 4 depicts an example of an ideal digital signal.
Figure 5:
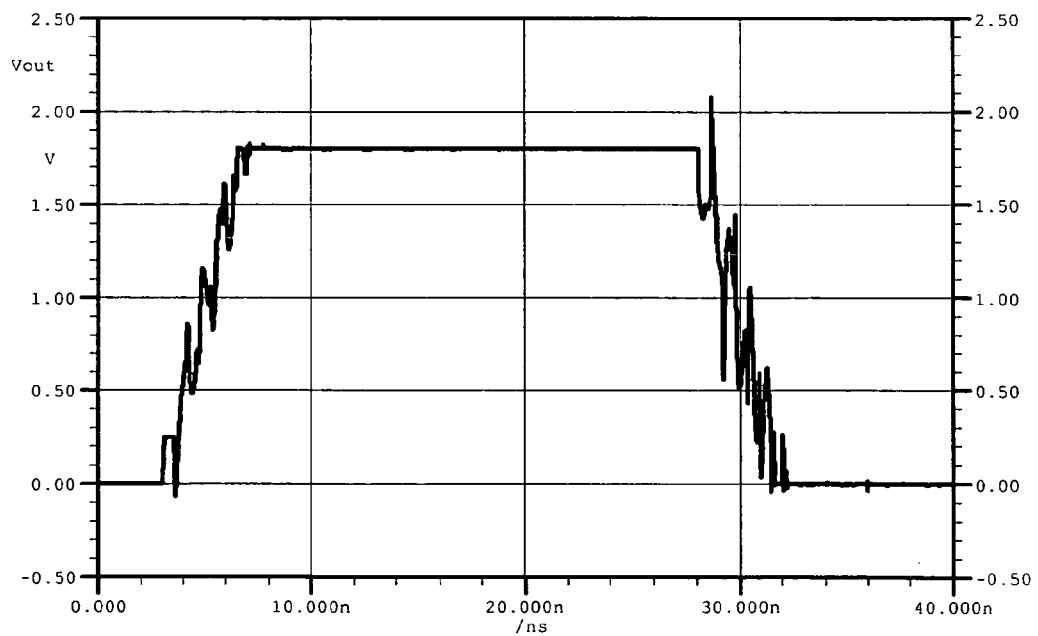
FIG. 5 depicts the ideal digital signal when coupled with the impedance established by the stripline and the capacitance.
Figure 6:
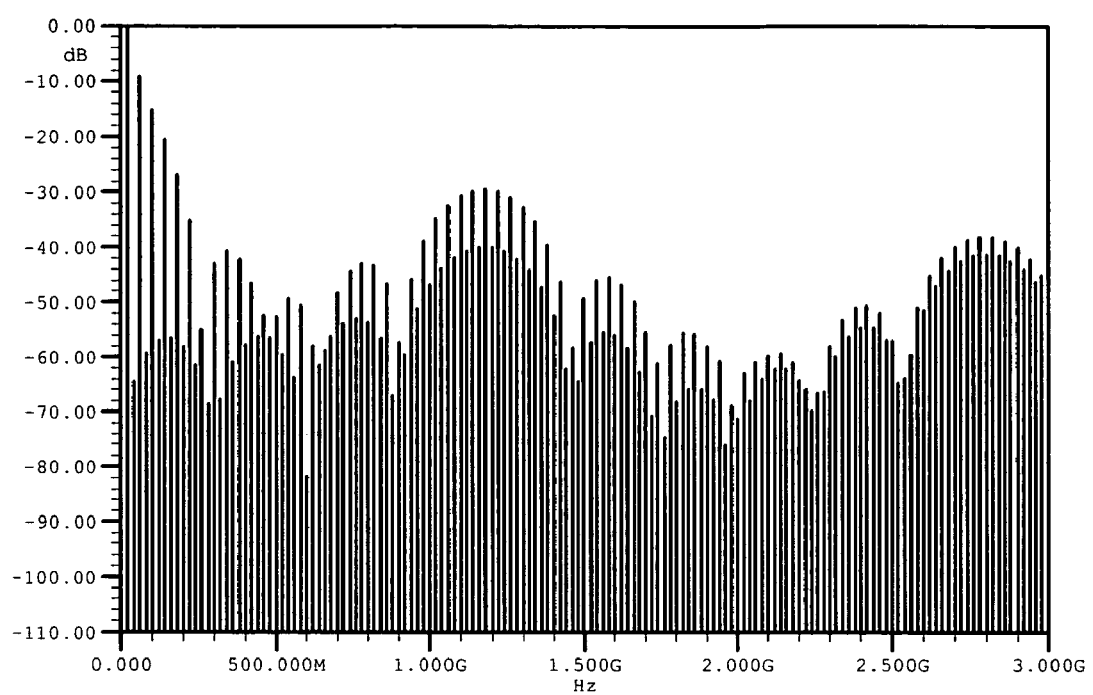
FIG. 6 depicts the spectrum of the ideal digital signal when coupled with the impedance established by the stripline and the capacitance.
Figure 14:
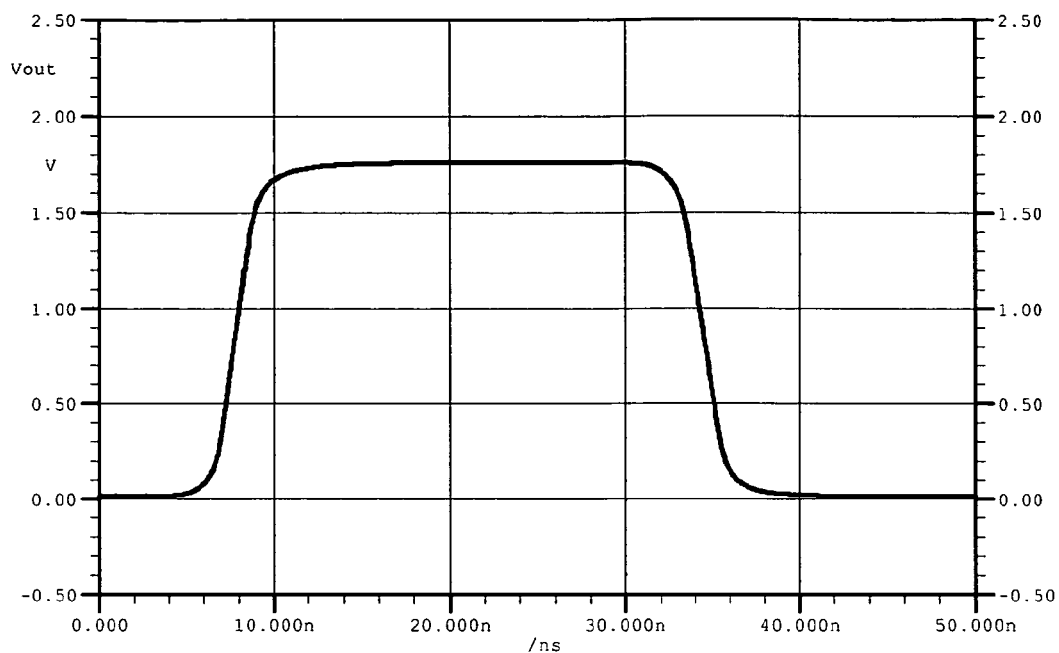
FIG. 14 depicts an example of the simulation results of the output signal Vout.
Figure 15:
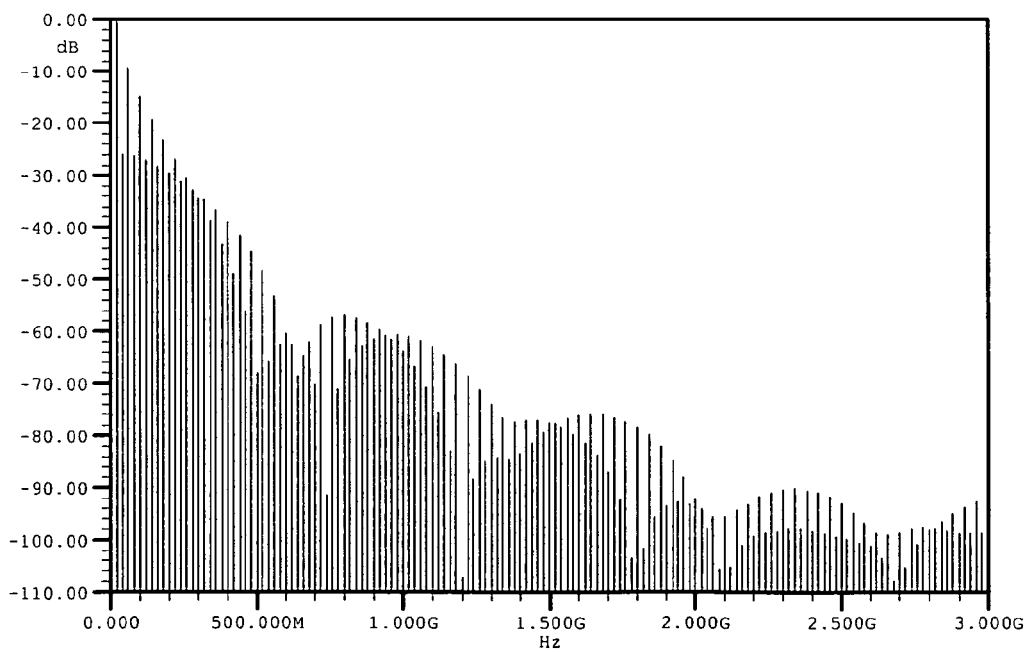
FIG. 15 depicts a Fourier transform of the signal of FIG. 14.

FIG. 14 depicts an example of a simulation result of the output signal Vout of various further embodiments of FIG. 7, when the load is generally in accordance with the example of FIG. 3 (e.g. capacitance Cx=3.5 pF, the length of the strip line L=50 mm, the width W=0.15 mm, distance from the ground plane H=0.15 mm, the material of the circuit board FR4). It can be observed from FIG. 14, that the pulse is relatively clear and does not have sharp edges or corners. The example of FIG. 15 depicts a Fourier transformation of the signal Vout of FIG. 7. Correspondingly, the simulation result of the known pulse form according to the prior art output stage is shown in FIG. 6.

The foregoing describes various further embodiments of the pulse modification circuit, wherein harmonics interference of digital signal can be reduced. The following describes yet various further embodiments of the invention, wherein the interference is even further reduced.

FIG. 15 depicts a spectrum with several significant minimums. The shape of the pulse and the rising and falling times have an effect on the position and magnitude of the minimums. According to various further embodiments of the invention, the rising time(s) and/or the falling time(s) and the shape of the pulse can be affected by capacitances C1 and C2 of FIG. 7.

In various further embodiments of FIG. 7, capacitances C1 and C2 are parallel coupled with another capacitances C1a and C2a. The capacitances C1a and C2a can be parallel coupled with the capacitances C1 and C2 with the control signal blocks SC1 and SC2, which are guided by switches S1 and S2. It should be noted that various further embodiments may have more than two switches and/or further capacitances. However, two switches and further capacitances provide four different combinations.

Figure 9:
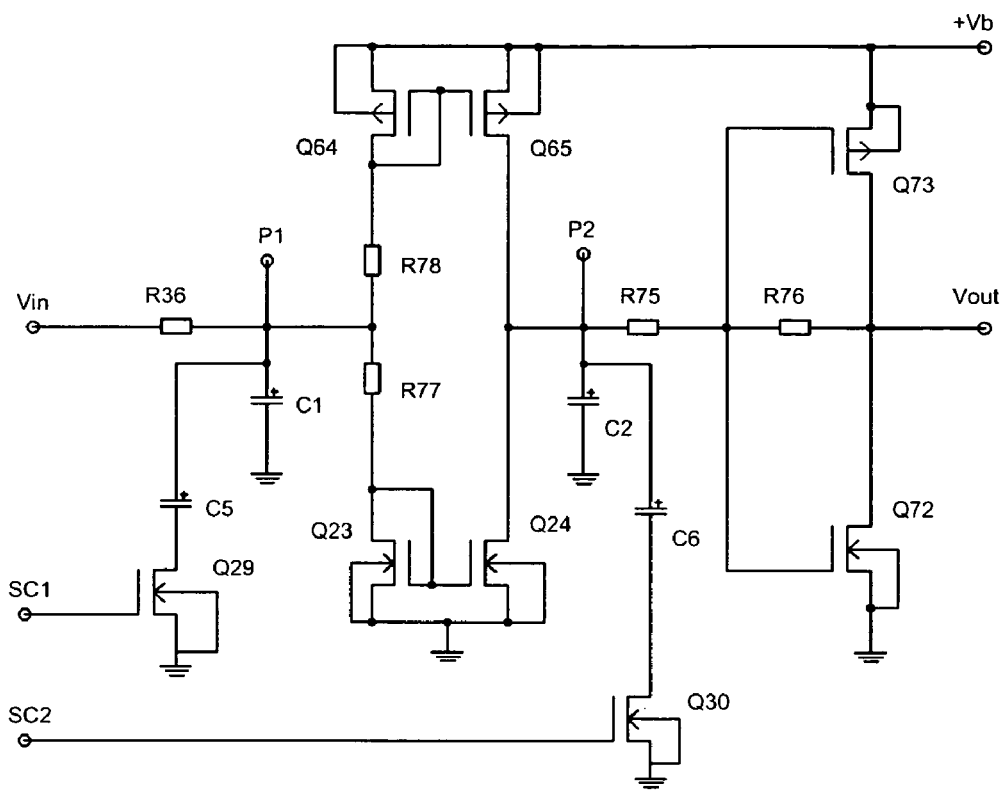
FIG. 9 depicts an example of a CMOS circuit diagram in accordance with various further embodiments of the invention.

Thereby a simple pulse generator establishes a programmable waveform generator or the like. Even a minor change in the rising and falling times or in the shape of the pulse can cause considerable changes in the high harmonics order. FIG. 9 depicts an example of CMOS circuit diagram 300 in accordance with various further embodiments of the invention.

Figure 16:
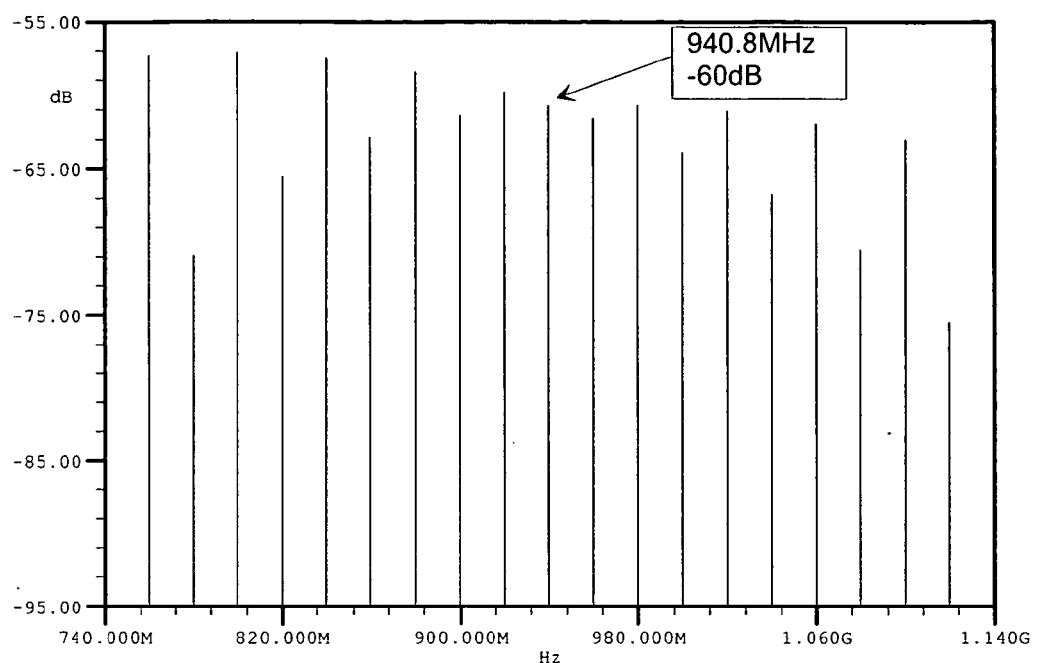
FIG. 16 depicts an example of the simulation results, wherein no further capacitances are coupled to the circuit.
Figure 17:
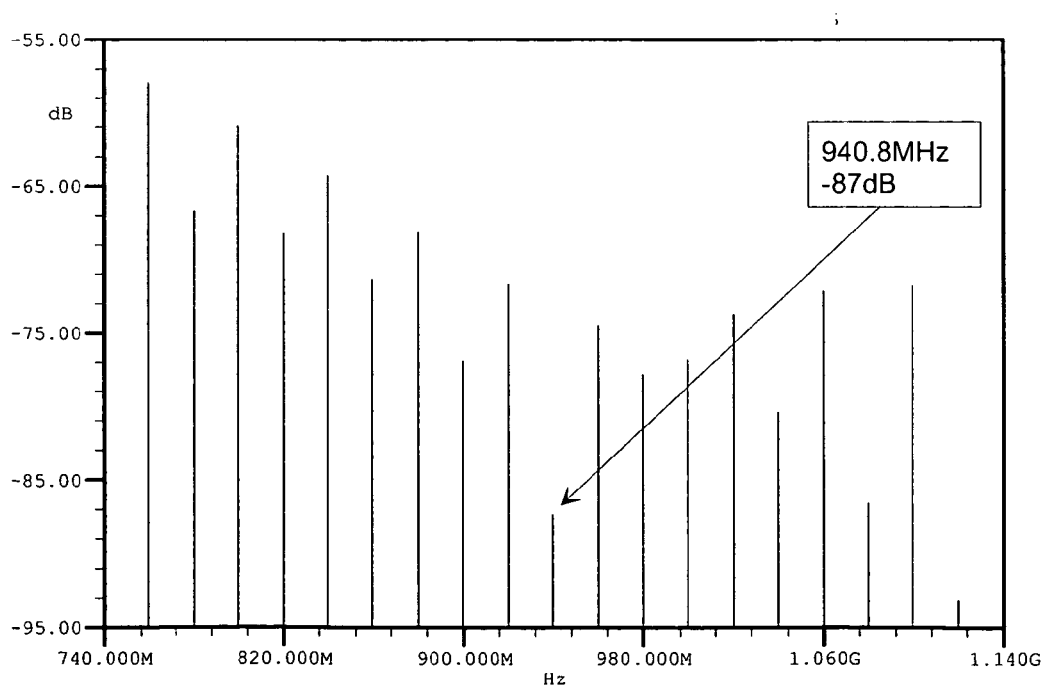
FIG. 17 depicts an example of the simulation results.

For example the clock frequency of the mobile station such as a mobile phone can be 19.2 MHz. A receiver uses or "listens" frequency 940.8 MHz. The reception channel is interfered by the 49$^{th}$ harmonics of the clock frequency. An example of this kind of scenario is depicted in FIG. 16, wherein the coupling or the switching does not have the further capacitances. FIG. 16 shows that the relative strength or magnitude of the 49$^{th}$ harmonics is −60 dB. When a further capacitance having a value 0.5 pF is parallel coupled with the capacitance C2, the magnitude of the 49$^{th}$ harmonics drops to a level of −87 dB. This is shown in the example of FIG. 17.

In accordance with various further embodiments of the invention at each channel frequency or use scenario, the wave form of the digital signal can be optimized so that the digital signal interferes less or not at all the operation of the apparatus. It should be noted that there is not necessarily always an interference caused by the digital signal at each channel or at each frequency. However if there is interference, it should be noted that the interference is difficult to reduce by known techniques.

Various further embodiments relates to the pulse shape. For detecting whether to amend the pulse shape or to discover or modify the appropriate pulse the following process can be used.

Because the channel frequencies, where the interference is present or detected, are generally known or they can be determined, the mobile station can be programmed to fixedly use predetermined settings. Alternatively the mobile station can be adjusted in manufacturing into the appropriate frequencies. The used control bits can be stored to the memory of the mobile station as well as the other settings. Advantageously, the implementation is relatively straightforward and corresponds to the known adjustment of the current mobile phones.

Furthermore alternatively, the mobile station can search an appropriate pulse form at the channels, where the interference occurs. Advantageously the implementation is also straightforward. For example, the received signal characteristics or quality, such as signal-to-noise ration, can be used. Based on information on the signal quality, the possible scenarios can be examined and the best option can be accordingly selected. The mobile phone can also store the approved option to the memory. Thereby the mobile phone becomes homing interference remover.

Various further embodiments of the relate to frequency scanning, selection and elimination Various further embodiments eliminate the interference effect in the desired range by a slight modification of the clock frequency causing the interference. For example the channel frequency is 950 MHz. Now the clock frequency 19 Mhz could be shifted upwards by say, 50 kHz, with the interference at the frequency 50×19.050 MHz=952.500 MHz. In other words, the interference would occur at a distance of 2.5 MHz from the received frequency 950 kHz, and the interference frequency would no longer affect the channel frequency 950.000 MHz at all. This was but one simple example for illustrating how easily such a difficult problem can be overcome.

Various further embodiments of the invention relate how to change the clock frequency of a display. Basically there are two options, which are both usable even in the same application:

1. Programming the mobile station such as the mobile phone to change the clock frequency of the display at the channel frequencies or in the systems that are known to involve clock frequency interferences.

2. In the case of poor quality of the received signal, programming the mobile station to perform a momentary test of modifying the clock frequency, e.g. to test whether the signal quality improves if the clock frequency of the display is shifted. If this modification is successful, the changed frequency will be taken into use, otherwise the original frequency can be readopted.

Figure 18:
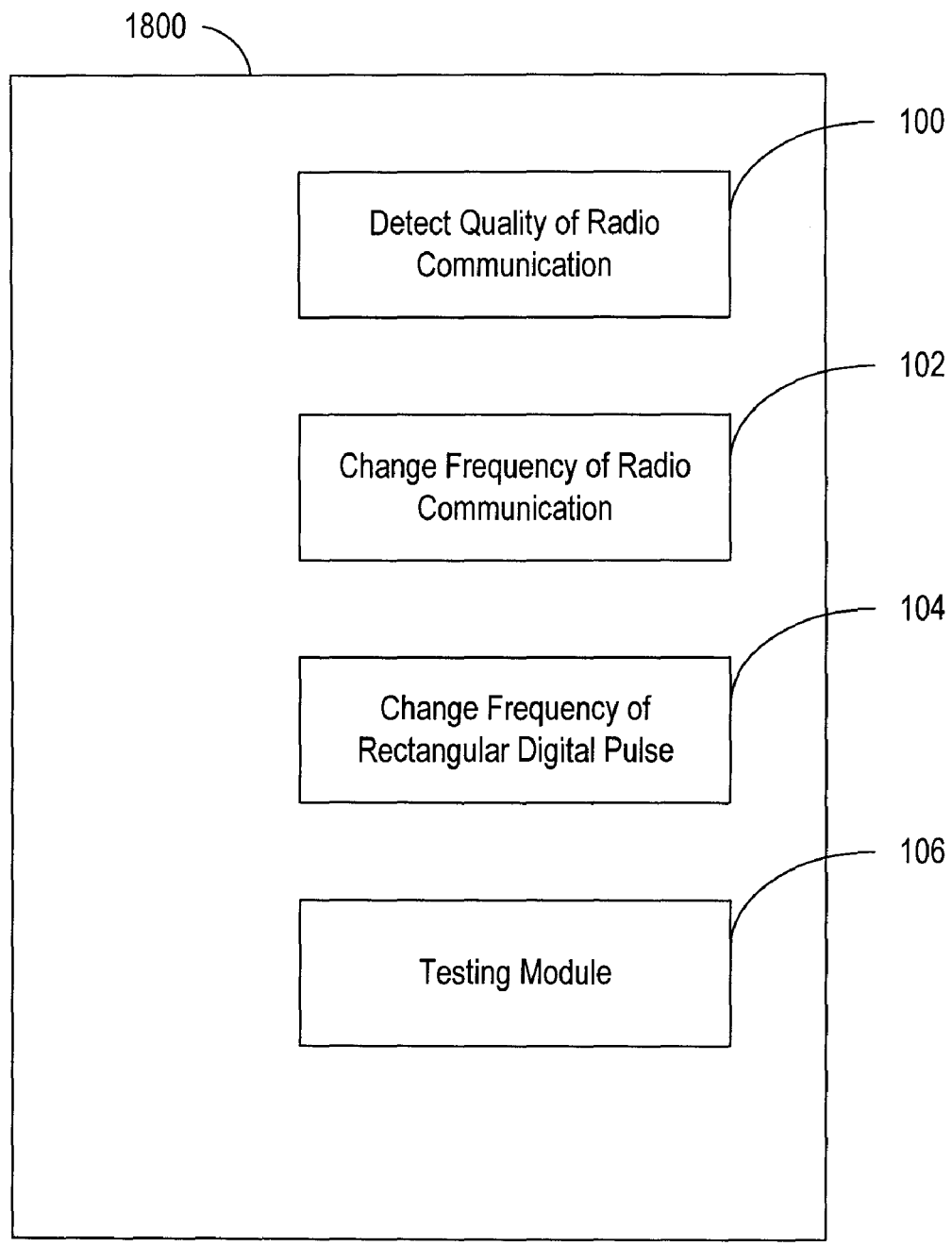
FIG. 18 is a block diagram of the invention where the apparatus comprises a circuit according to various embodiments described.

As shown in FIG. 18, an apparatus may comprise a circuit 1800 that may comprise a block 100 configured to detect a quality of a radio communication of the apparatus, and a block 102 configured to change the frequency of the radio communication so that interference of the substantially rectangular high frequency digital pulse can be reduced. A block 104 can be configured to change a frequency of the substantially rectangular high frequency digital pulse so that the interference of the substantially rectangular high frequency digital pulse to the radio communication of the apparatus can be reduced. Further, the apparatus can comprise a module 106 for testing whether the radio communication quality improves if the frequency of the substantially rectangular high frequency digital pulse is shifted.

The first option has the benefit of a simple and straightforward process embodiment by block within the apparatus. The second option could have the advantage of being operative in unpredictable circumstances. Thus, for instance, the manufacturer of a display module could modify his production so that the rise and fall times of the clock signal would result in a substantial increase of the harmonic level at a given radio frequency. In case problems had not been acknowledged on this channel at the planning stage of the phone, the first method would not work, but the latter one would.

GPS reception, for instance, calls for conditions free of interferences, which means that even a minor frequency change of the interference frequency allows maximation of the GPS reception sensitivity. Also, interference problems in GPS reception often appear only at the stage when the phone is almost completed.

Thus in various further embodiments of the invention, the device proper attempts to eliminate the problems it has caused itself.

Ramifications and Scope

Although the description above contains many specifics, these are merely provided to illustrate the invention and should not be construed as limitations of the invention's scope. It should be also noted that the many specifics can be combined in various ways in a single or multiple embodiments. Thus it will be apparent to those skilled in the art that various modifications and variations can be made in the apparatuses and processes of the present invention without departing from the spirit or scope of the invention.

What is claimed is:

1. A circuit configured to round first, second, third and fourth edges of a substantially rectangular high frequency digital pulse, comprising:
   a first rounding block, a second rounding block and an output stage, wherein
   the first rounding block is configured to round said second and fourth edges so that rising and falling times of said substantially rectangular high frequency digital pulse are prolonged,
   the second rounding block is configured to round said first and third edges in accordance with non-linear characteristics of a semiconductor of said second rounding block, and
   the output stage comprises a feedback circuit, wherein the first rounding block is coupled with the second rounding block and the second rounding block is coupled with said feedback circuit, wherein said circuit is accordingly configured to attenuate harmonics interference of said substantially rectangular high frequency digital pulse.

2. The circuit according to claim 1, wherein the first rounding block is configured to round said second and fourth edges and thereafter the second rounding block is configured to round said first and third edges.

3. The circuit according to claim 2, wherein the first rounding block is configured to prolong rising and falling times of the substantially rectangular high frequency pulse, and the second rounding block is configured to act non-linearly to the substantially rectangular high frequency pulse based on the prolonged rising and falling times.

4. The circuit according to claim 1, wherein the first rounding block comprises a time constant circuit.

5. The circuit according to claim 4, wherein a capacitor and a resistor establishes the time constant circuit.

6. The circuit according to claim 5, wherein the time constant circuit further comprises a second resistor and a third resistor coupled in series with the first resistor.

7. The circuit according to claim 6, wherein the resistance of the second and third resistors is larger than the resistance of the first resistor.

8. The circuit according to claim 1, wherein the first rounding block comprises resistances, current mirrors and capacitances, which are based on the next stage resistive load.

9. The circuit according to claim 1, wherein the second rounding block comprises metal oxide semiconductor field-effect transistor.

10. The circuit according to claim 9, wherein the second rounding block comprises an inverter circuit.

11. The circuit according to claim 1, wherein the second rounding block comprises two current mirror circuits, which are controlled by resistances.

12. The circuit according to claim 11, wherein the current mirror circuit are configured to act linearly at the middle range of the voltage of the substantially rectangular high frequency pulse so that the middle voltage of the substantially rectangular high frequency pulse is not substantially rounded.

13. The circuit according to claim 1, wherein the output stage comprises a resistive feedback circuit.

14. The circuit according to claim 1, wherein the circuit further comprises a capacitor connected to earth between the first and the second rounding block.

15. The circuit according to claim 14, wherein the circuit further comprises another capacitor parallel coupled with said capacitor between the first and the second rounding block.

16. The circuit according to claim 15, wherein the circuit further comprises a control signal block for coupling the another capacitor to an on/off of the circuit.

17. The circuit according to claim 1, wherein the circuit further comprises a capacitor connected to earth between the second rounding block and the output stage.

18. The circuit according to claim 17, wherein the circuit further comprises another capacitor parallel coupled with said capacitor between the first and the second rounding block.

19. The circuit according to claim 18, wherein the circuit further comprises a control signal block for coupling the another capacitor to an on/off of the circuit.

20. An apparatus comprising the circuit according to claim 19, wherein the apparatus further comprises a block configured to detect a quality of a radio communication of the apparatus, and a block configured to change a frequency of the radio communication so that interference of the substantially rectangular high frequency digital pulse can be reduced.

21. The apparatus according to claim 20, wherein the apparatus further comprises means for testing whether the radio communication quality improves if the frequency of the substantially rectangular high frequency digital pulse is shifted.

22. An apparatus comprising the circuit according to claim 19, wherein the apparatus further comprises a block configured to change a frequency of the substantially rectangular high frequency digital pulse so that the interference of the substantially rectangular high frequency digital pulse to a radio communication of the apparatus can be reduced.

23. The apparatus according to claim 19, wherein the apparatus comprises a mobile phone.

24. An apparatus comprising the circuit according to claim 1 configured to attenuate the harmonics interference of the substantially rectangular high frequency digital pulse on radio frequencies used by the apparatus.

25. The circuit according to claim 1, wherein the feedback circuit is configured to establish a negative feedback.

26. The circuit according to claim 25, wherein the feedback circuit is configured to oppose said digital pulse.

27. The circuit according to claim 1, wherein the frequency of said substantially rectangular high frequency digital pulse is at least 19 MHz.

28. A circuit for rounding first, second, third and fourth edges of a substantially rectangular high frequency digital pulse, comprising:

first rounding means, second rounding means and an output stage wherein the first rounding means is configured to round said second and fourth edges so that rising and falling times of said high frequency digital pulse are prolonged, the second rounding means is configured to round said first and third edges in accordance with non-linear characteristics of a semiconductor of said second rounding block, and the output stage comprises a feedback circuit, wherein the first rounding means is coupled with the second rounding means and the second rounding means is coupled with said feedback circuit, wherein said circuit is configured to attenuate harmonics interference of said high frequency digital pulse.

29. The circuit according to claim 28, wherein the first rounding means is configured to round said second and fourth edges and thereafter the second rounding means is configured to round said first and third edges.

30. The circuit according to claim 29, wherein the first rounding means is configured to prolong rising and falling times of the pulse, and the second rounding means is configured to act non-linearly to the pulse based on the prolonged rising and falling times.

* * * * *

UNITED STATES PATENT AND TRADEMARK OFFICE
CERTIFICATE OF CORRECTION

PATENT NO. : 7,646,211 B2  Page 1 of 1
APPLICATION NO. : 11/397920
DATED : January 12, 2010
INVENTOR(S) : Risto Väisänen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 418 days.

Signed and Sealed this

Twenty-eighth Day of December, 2010

David J. Kappos
*Director of the United States Patent and Trademark Office*